United States Patent
Matsui et al.

(10) Patent No.: US 7,885,136 B2
(45) Date of Patent: Feb. 8, 2011

(54) SEMICONDUCTOR MEMORY DEVICE HAVING HIGH STABILITY AND QUALITY OF READOUT OPERATION

(75) Inventors: Katsuaki Matsui, Kanagawa (JP); Junichi Ogane, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 120 days.

(21) Appl. No.: 12/409,731

(22) Filed: Mar. 24, 2009

(65) Prior Publication Data

US 2009/0245002 A1    Oct. 1, 2009

(30) Foreign Application Priority Data

Mar. 26, 2008    (JP) .............................. 2008-080494

(51) Int. Cl.
*G11C 8/00* (2006.01)
(52) U.S. Cl. .............................. 365/230.02; 365/189.02; 365/203
(58) Field of Classification Search ................. 365/207, 365/205, 230.03, 230.02, 189.02, 189.08, 365/203
See application file for complete search history.

(56) References Cited

U.S. PATENT DOCUMENTS

| | | | |
|---|---|---|---|
| 6,467,056 B1 * | 10/2002 | Satou et al. .................. | 714/720 |
| 2005/0265107 A1 | 12/2005 | Tanaka | |
| 2006/0239059 A1 | 10/2006 | Murata | |

\* cited by examiner

*Primary Examiner*—Richard Elms
*Assistant Examiner*—Hien N Nguyen
(74) *Attorney, Agent, or Firm*—Volentine & Whitt, P.L.L.C.

(57) ABSTRACT

A semiconductor memory cell device includes a first multiplexer selecting a sub-block including a memory cell storing data to be read out in a row, a drain selector selecting a first column line connected to one terminal of the memory cell to be read, a precharge selector selecting a second column line connected to the other terminal of the memory cells adjacent to the one terminal of the memory cell storing the data to be readout, a second multiplexer selecting the sub-block including the second column line, a source selector selecting a third column line connected to the other terminal of the memory cell storing the data to be read out. The second multiplexer and precharge selector, when selecting, apply a first voltage to the second column line, and the source selector, when selecting, applies a second voltage to the third column line.

6 Claims, 15 Drawing Sheets

FIG. 7A

| MULTI-VALUED MEMORY CELL | 246 | | 248 | | 250 | | 252 | | 254 | | 256 | | 258 | | 260 | |
|---|---|---|---|---|---|---|---|---|---|---|---|---|---|---|---|---|
| READOUT DIRECTION | ↓ | ↑ | ↓ | ↑ | ↓ | ↑ | ↓ | ↑ | ↓ | ↑ | ↓ | ↑ | ↓ | ↑ | ↓ | ↑ |
| 110(PS07) | 0 | 1 | 0 | 0 | 0 | 0 | 0 | 0 | 0 | 0 | 1 | 0 | 0 | 0 | 0 | 0 |
| 108(PS06) | 0 | 0 | 0 | 0 | 0 | 0 | 0 | 0 | 1 | 0 | 0 | 0 | 0 | 0 | 0 | 1 |
| 106(PS05) | 0 | 0 | 0 | 0 | 0 | 0 | 1 | 0 | 0 | 0 | 0 | 0 | 0 | 1 | 0 | 0 |
| 104(PS04) | 0 | 0 | 0 | 1 | 1 | 0 | 0 | 0 | 0 | 0 | 0 | 1 | 0 | 0 | 0 | 0 |
| 102(PS03) | 0 | 0 | 1 | 0 | 0 | 0 | 0 | 0 | 0 | 1 | 0 | 0 | 0 | 0 | 0 | 0 |
| 100(PS02) | 1 | 0 | 0 | 0 | 0 | 1 | 0 | 1 | 0 | 0 | 0 | 0 | 0 | 0 | 0 | 0 |
| 98(PS01) | 0 | 0 | 0 | 0 | 0 | 0 | 0 | 0 | 0 | 0 | 0 | 0 | 0 | 0 | 1 | 0 |
| 96(PS00) | 0 | 0 | 0 | 1 | 0 | 0 | 0 | 0 | 0 | 0 | 0 | 0 | 1 | 0 | 0 | 0 |

FIG. 7B

| MULTI-VALUED MEMORY CELL | 246 | | 248 | | 250 | | 252 | | 254 | | 256 | | 258 | | 260 | |
|---|---|---|---|---|---|---|---|---|---|---|---|---|---|---|---|---|
| READOUT DIRECTION | ↑ | ↓ | ↑ | ↓ | ↑ | ↓ | ↑ | ↓ | ↑ | ↓ | ↑ | ↓ | ↑ | ↓ | ↑ | ↓ |
| 196(SS07) | 0 | 0 | 0 | 0 | 0 | 0 | 0 | 0 | 0 | 0 | 0 | 0 | 1 | 0 | 0 | 1 |
| 194(SS06) | 0 | 0 | 0 | 0 | 0 | 0 | 0 | 0 | 0 | 0 | 0 | 0 | 0 | 1 | 0 | 0 |
| 192(SS05) | 0 | 0 | 0 | 0 | 0 | 0 | 0 | 0 | 0 | 0 | 1 | 0 | 0 | 0 | 0 | 0 |
| 190(SS04) | 0 | 0 | 0 | 0 | 0 | 0 | 0 | 0 | 1 | 0 | 0 | 1 | 0 | 0 | 0 | 0 |
| 188(SS03) | 0 | 0 | 0 | 0 | 0 | 0 | 1 | 0 | 0 | 1 | 0 | 0 | 0 | 0 | 0 | 0 |
| 186(SS02) | 0 | 0 | 0 | 1 | 1 | 0 | 0 | 1 | 0 | 0 | 0 | 0 | 0 | 0 | 0 | 0 |
| 184(SS01) | 1 | 0 | 1 | 0 | 0 | 1 | 0 | 0 | 0 | 0 | 0 | 0 | 0 | 0 | 0 | 0 |
| 182(SS00) | 0 | 1 | 0 | 0 | 0 | 0 | 0 | 0 | 0 | 0 | 0 | 0 | 0 | 0 | 0 | 0 |

FIG. 7C

| MULTI-VALUED MEMORY CELL | 246 | | 248 | | 250 | | 252 | | 254 | | 256 | | 258 | | 260 | |
|---|---|---|---|---|---|---|---|---|---|---|---|---|---|---|---|---|
| READOUT DIRECTION | ↓ | ↑ | ↓ | ↑ | ↓ | ↑ | ↓ | ↑ | ↓ | ↑ | ↓ | ↑ | ↓ | ↑ | ↓ | ↑ |
| 228(DS07) | 0 | 0 | 0 | 0 | 0 | 0 | 0 | 0 | 0 | 0 | 0 | 0 | 1 | 0 | 0 | 1 |
| 226(DS06) | 0 | 0 | 0 | 0 | 0 | 0 | 0 | 0 | 0 | 0 | 1 | 0 | 0 | 1 | 0 | 0 |
| 224(DS05) | 0 | 0 | 0 | 0 | 0 | 0 | 0 | 0 | 1 | 0 | 0 | 1 | 0 | 0 | 0 | 0 |
| 222(DS04) | 0 | 0 | 0 | 0 | 0 | 0 | 1 | 0 | 0 | 1 | 0 | 0 | 0 | 0 | 0 | 0 |
| 220(DS03) | 0 | 0 | 0 | 0 | 1 | 0 | 0 | 1 | 0 | 0 | 0 | 0 | 0 | 0 | 0 | 0 |
| 218(DS02) | 0 | 1 | 1 | 0 | 0 | 1 | 0 | 0 | 0 | 0 | 0 | 0 | 0 | 0 | 0 | 0 |
| 216(DS01) | 1 | 0 | 0 | 1 | 0 | 0 | 0 | 0 | 0 | 0 | 0 | 0 | 0 | 0 | 0 | 0 |
| 214(DS00) | 0 | 0 | 1 | 0 | 0 | 0 | 0 | 0 | 0 | 0 | 0 | 0 | 0 | 0 | 0 | 0 |
| 36(PY(i-1)) | 0 | 1 | 0 | 1 | 0 | 1 | 0 | 1 | 0 | 1 | 0 | 1 | 0 | 1 | 0 | 1 |
| 38(PY(i)) | 1 | 0 | 1 | 0 | 1 | 0 | 1 | 0 | 1 | 0 | 1 | 0 | 1 | 0 | 1 | 0 |
| 40(PY(i+1)) | 0 | 0 | 0 | 0 | 0 | 0 | 0 | 0 | 0 | 0 | 0 | 0 | 0 | 0 | 0 | 0 |
| 68(RY(i-1)) | 0 | 0 | 0 | 0 | 0 | 0 | 0 | 0 | 0 | 0 | 0 | 0 | 0 | 0 | 0 | 0 |
| 70(RY(i)) | 1 | 1 | 1 | 1 | 1 | 1 | 1 | 1 | 1 | 1 | 1 | 1 | 1 | 1 | 1 | 1 |
| 72(RY(i+1)) | 0 | 0 | 0 | 0 | 0 | 0 | 0 | 0 | 0 | 0 | 0 | 0 | 0 | 0 | 0 | 0 |

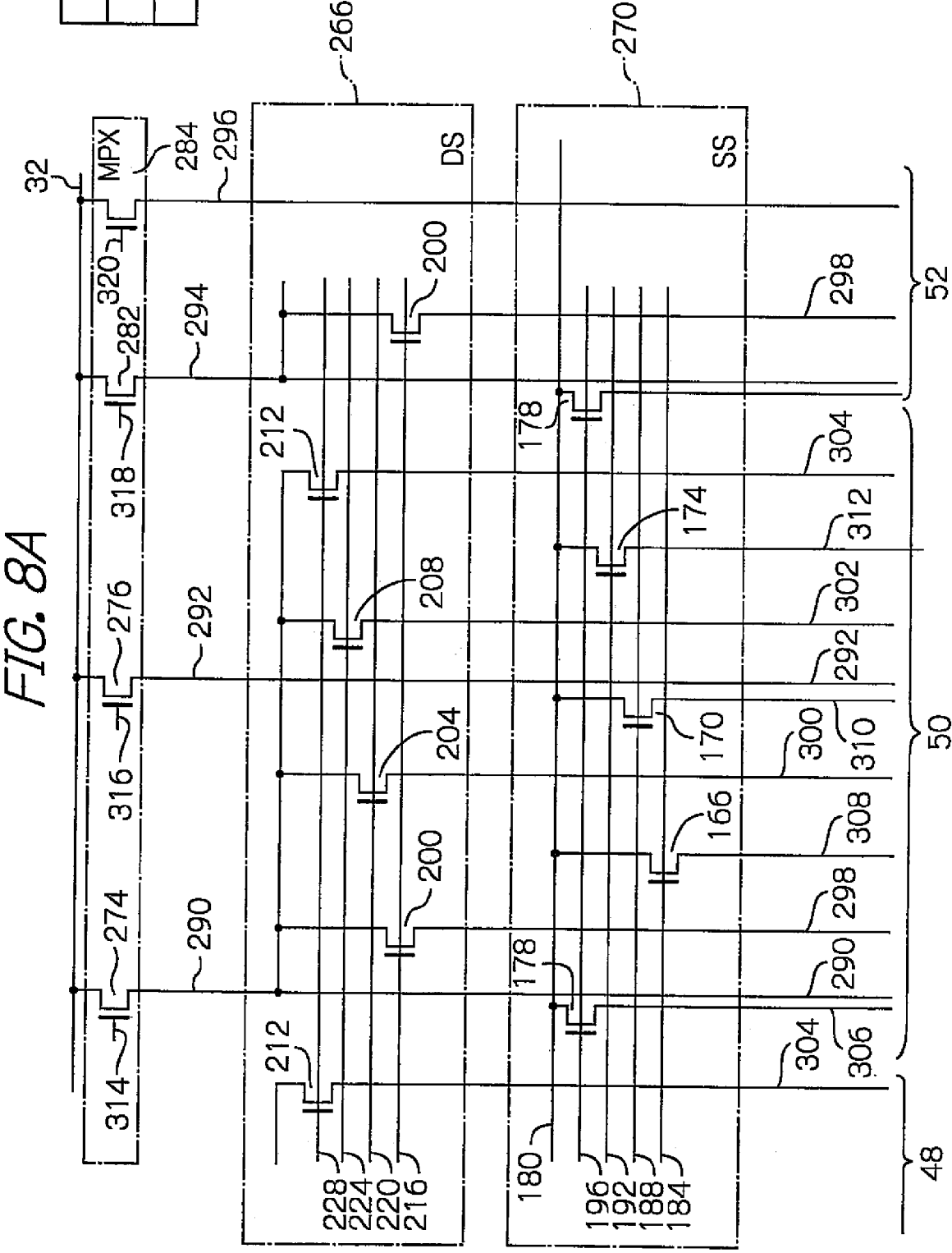

FIG. 9A

| MULTI-VALUED MEMORY CELL | 330 | | 332 | | 334 | | 336 | | 338 | | 340 | | 342 | | 344 | |
|---|---|---|---|---|---|---|---|---|---|---|---|---|---|---|---|---|
| READOUT DIRECTION | ↓ | ↑ | ↓ | ↑ | ↓ | ↑ | ↓ | ↑ | ↓ | ↑ | ↓ | ↑ | ↓ | ↑ | ↓ | ↑ |
| 228(DS07) | 0 | 1 | 0 | 0 | 0 | 0 | 0 | 0 | 0 | 0 | 1 | 0 | 1 | 0 | 0 | 0 |
| 226(DS06) | 0 | 0 | 0 | 0 | 0 | 0 | 0 | 0 | 0 | 1 | 1 | 1 | 0 | 1 | 0 | 0 |
| 224(DS05) | 0 | 0 | 0 | 0 | 0 | 0 | 1 | 1 | 1 | 1 | 0 | 0 | 0 | 1 | 0 | 0 |
| 222(DS04) | 0 | 0 | 1 | 0 | 1 | 1 | 1 | 1 | 1 | 0 | 1 | 0 | 0 | 0 | 0 | 0 |
| 220(DS03) | 0 | 0 | 1 | 0 | 1 | 0 | 0 | 0 | 0 | 0 | 0 | 0 | 0 | 0 | 0 | 0 |
| 218(DS02) | 1 | 0 | 0 | 0 | 0 | 1 | 0 | 0 | 0 | 0 | 0 | 0 | 0 | 0 | 0 | 0 |
| 216(DS01) | 1 | 0 | 0 | 1 | 0 | 1 | 0 | 0 | 0 | 0 | 0 | 0 | 0 | 0 | 0 | 1 |
| 214(DS00) | 0 | 0 | 0 | 1 | 0 | 0 | 0 | 0 | 0 | 0 | 0 | 0 | 0 | 1 | 0 | 1 |

FIG. 9B

| MULTI-VALUED MEMORY CELL | READOUT DIRECTION | 330 ↓ | 330 ↑ | 332 ↓ | 332 ↑ | 334 ↓ | 334 ↑ | 336 ↓ | 336 ↑ | 338 ↓ | 338 ↑ | 340 ↓ | 340 ↑ | 342 ↓ | 342 ↑ | 344 ↓ | 344 ↑ |
|---|---|---|---|---|---|---|---|---|---|---|---|---|---|---|---|---|---|
| 196(SS07) | | 1 | 0 | 0 | 0 | 0 | 0 | 0 | 0 | 0 | 0 | 0 | 0 | 0 | 0 | 0 | 1 |
| 194(SS06) | | 0 | 0 | 0 | 0 | 0 | 0 | 0 | 0 | 0 | 0 | 0 | 0 | 0 | 0 | 1 | 0 |
| 192(SS05) | | 0 | 0 | 0 | 0 | 0 | 0 | 0 | 0 | 0 | 0 | 0 | 0 | 1 | 0 | 0 | 0 |
| 190(SS04) | | 0 | 0 | 0 | 0 | 0 | 0 | 0 | 0 | 0 | 0 | 1 | 0 | 0 | 0 | 0 | 0 |
| 188(SS03) | | 0 | 0 | 0 | 0 | 0 | 0 | 0 | 0 | 1 | 0 | 0 | 0 | 0 | 0 | 0 | 0 |
| 186(SS02) | | 0 | 0 | 0 | 0 | 0 | 0 | 1 | 0 | 0 | 0 | 0 | 0 | 0 | 0 | 0 | 0 |
| 184(SS01) | | 0 | 0 | 1 | 0 | 0 | 1 | 0 | 0 | 0 | 0 | 0 | 0 | 0 | 0 | 0 | 0 |
| 182(SS00) | | 0 | 1 | 0 | 0 | 0 | 0 | 0 | 0 | 0 | 0 | 0 | 0 | 0 | 0 | 0 | 0 |

FIG. 9C

| MULTI-VALUED MEMORY CELL | 330 | | 332 | | 334 | | 336 | | 338 | | 340 | | 342 | | 344 | |
|---|---|---|---|---|---|---|---|---|---|---|---|---|---|---|---|---|
| READOUT DIRECTION | ↓ | ↑ | ↓ | ↑ | ↓ | ↑ | ↓ | ↑ | ↓ | ↑ | ↓ | ↑ | ↓ | ↑ | ↓ | ↑ |
| 298(PYE(i)) | 0 | 1 | 1 | 0 | 0 | 1 | 1 | 0 | 0 | 1 | 1 | 1 | 0 | 1 | 0 | 0 |
| 300(PYO(i)) | 1 | 0 | 0 | 1 | 1 | 0 | 0 | 1 | 1 | 0 | 0 | 1 | 0 | 0 | 0 | 0 |
| 302(PYE(i+1)) | 0 | 0 | 0 | 0 | 0 | 0 | 0 | 0 | 0 | 0 | 0 | 0 | 0 | 0 | 1 | 1 |
| 304(PYO(i+1)) | 0 | 0 | 0 | 0 | 0 | 0 | 0 | 0 | 1 | 1 | 0 | 0 | 1 | 0 | 0 | 0 |
| 306(RYE(i)) | 1 | 1 | 1 | 0 | 1 | 0 | 1 | 0 | 0 | 1 | 0 | 1 | 1 | 0 | 0 | 1 |
| 308(RYO(i)) | 0 | 0 | 0 | 1 | 0 | 1 | 0 | 1 | 1 | 0 | 1 | 0 | 0 | 1 | 1 | 0 |
| 310(RYE(i+1)) | 0 | 0 | 0 | 0 | 0 | 0 | 0 | 0 | 0 | 0 | 0 | 0 | 0 | 0 | 0 | 0 |
| 312(RYO(i+1)) | 0 | 0 | 0 | 0 | 0 | 0 | 0 | 0 | 0 | 0 | 0 | 0 | 0 | 0 | 0 | 1 |

SEMICONDUCTOR MEMORY DEVICE HAVING HIGH STABILITY AND QUALITY OF READOUT OPERATION

BACKGROUND OF THE INVENTION

1. Field of the Invention

The present invention relates to a semiconductor memory device, and more particularly to a semiconductor memory device having nonvolatile memory cells to which a voltage is applied to read out data stored therein.

2. Description of the Background Art

Conventionally, various types of flash memory have been proposed, one of which is of a so-called "multi-valued memory cell". The "multi-valued memory cell" may be a nonvolatile memory cell which can store two kinds of data and output the stored data in different directions. The flash memory may often include an array of multi-valued memory cells aligned in the form of matrix. Technique employed for such flash memories is disclosed by, for example, U.S. Patent Application Publication Nos. US2005/0265107 A1 to Tanaka and US2006/0239059 A1 to Murata.

The memory cell array circuit taught by Murata is formed into a plurality of sub-blocks, each of which includes eight drain selectors, each of which includes an N (Negative)-channel MOS-FET (Metal-Oxide Semiconductor Field-Effect Transistor), i.e. NMOS-FET. Each NMOS-FET has its source electrode connected to a common power supply line and its gate electrode connected to a corresponding drain select line. Each drain selector, made up of an NMOS-FET, has its drain electrode connected to the source electrode of a corresponding source selector. As described above, the wiring between the drain electrode of the drain selector and the source electrode of the source selector functions as a bit line. The bit lines are also connected to memory cells described below. The source selectors also include NMOS-FETs. The plurality of bit lines is arranged to intersect a plurality of word lines at the respective cross points of the matrix.

The memory cells are multi-valued memory cells, each of which is capable of storing two pieces of data different between two directions. In the vertical direction of the matrix, there are arranged N+1 memory cells between the drain electrode of the drain selector and the source electrode of the source selector, where N is a natural number. In the horizontal direction of the matrix, there is arranged a memory cell in an area formed between the drain selectors adjacent to each other. In the column direction of the matrix, the memory cells have the source electrode thereof commonly connected to the same bit line and the drain electrode thereof commonly connected to another bit line. Thus, each memory cell has its source electrode connected to the drain electrode of another memory cell adjacent thereto in the horizontal direction by the bit line. The memory cells have the gate electrode thereof connected to a word line wired in the horizontal direction. The arrangement of the memory cells provides the N+1 word lines.

Every four of the source selectors form a set of source selectors, and the four source select lines are connected to the respective gate electrodes of different sets of four source selectors. The source selectors have the drain electrodes thereof connected to multiplexers, each of which includes a pair of NMOS-FETs. The pair of NMOS-FETs in each multiplexer have the gate electrodes thereof commonly interconnected to each other and connected to a column select line. The pair of NMOS-FET in each multiplexer has the drain electrodes connected to respective sense amplifiers so that the odd-numbered, in other words, left NMOS-FET in each multiplexer has its drain electrode connected to a sense amplifier different from one connected to the even-numbered NMOS-FET.

Next, the principle operation of the multi-valued memory cell will be described. This multi-valued memory cell is a nonvolatile memory cell having the MOS-FET structure. The multi-valued memory cell has a P (Positive)-well region formed in a semiconductor substrate. On the surface of the P-well region, a gate electrode is formed with a gate insulating film intervening. On the sidewall of the gate electrode, there is formed a memory entity, or entity, composed of a nitride film. In the surface of the P-well regions, N-type diffusion regions are formed to partly extend below the memory entity. These diffusion regions alternatively function as a source or a drain electrode in response to a voltage applied thereto.

In the write operation to the multi-valued memory cell, electrons are injected into each memory entity to write data. In order to write the data into the left memory entity, the right diffusion region is set as a source electrode, and the left diffusion region is set as a drain electrode. The diffusion region and the P-well region are biased to 0V (volt), and the diffusion region and the gate electrode are biased to +5V. By this biasing, the inversion layer extends from the diffusion region adjacent to the source electrode, but is pinched off before reaching the diffusion region adjacent to the drain electrode in the multi-valued memory cell. The electrons are accelerated by the high electric field from the pinch-off point to the diffusion region, becoming so-called hot electrons.

The hot electrons are injected into the left memory entity to write the data. On the other hand, no hot electrons are generated in the vicinity of the right memory entity, so that no data are written. In order to write data into the right memory entity, the left diffusion region can be set as the source electrode and the right diffusion region as the drain electrode.

In the readout operation from the multi-valued memory cell, in order to read the data stored in the left memory entity, the left and left diffusion regions are set as the source and drain electrodes, respectively, to make the multi-valued memory cell operative. The diffusion region and P-well region are biased to 0V, the diffusion region is biased to +1.8V, and the gate electrode is biased to +2V. In this case, if no electrons are stored in the left memory entity, a drain current readily flows to the multi-valued memory cell. By contrast, if electrons are stored in the left memory entity, hardly any inversion layer forms therebelow, so that hardly any drain current flows. Accordingly, the data stored in the left memory entity can be read out by detecting the drain current. In order to read out the data stored in the right memory entity, the right and left diffusion regions are set as the source and drain electrodes, respectively, to render the multi-valued memory, cell operative.

In addition, the operation of erasing the data stored in the multi-valued memory cell will be described. In order to erase the data stored in the left memory entity, the PN (Positive-Negative)-junction between the left diffusion region and P-well region is reversely biased by positively biasing the left diffusion region to +5V and the P-well region to 0V. In addition, the gate electrode is negatively biased to −5V. The right diffusion region is biased to 0V. The potential gradient at the PN-junction thereby becomes especially steep in the vicinity of the gate electrode due to the negatively biased gate electrode. This induces band-to-band tunneling and generates hot holes on the P-well region side of the PN-junction. The hot holes are attracted towards the negatively biased gate electrode and injected into the left memory entity, thus erasing the data stored therein. In order to erase the data stored in the right memory entity, the potentials applied to the left and right diffusion regions are opposite to what are described above.

As described above, in the multi-valued memory cell adapted for storing two bits, the memory entities are formed on the left and right sidewalls of the gate electrode, and the left and right diffusion regions corresponding to the two memory entities are set as a source and a drain electrode, respectively, or as a drain and a source electrode, respectively, thus using the multi-valued memory cell to store two bits of data.

In an array of multi-valued memory cells aligned in a lattice-like structure, when data are to be read out from the left of a multi-valued memory cell in the third column toward another multi-valued memory cell adjacent thereto at the right in the (N−1)th line of a certain sub-block, and at the same, time data are read out from the right of a multi-valued memory cell in the first column toward another multi-valued memory cell adjacent thereto at the left in the (N−1)th line of another sub-block, the voltages will be applied in the following manner.

The word line in the (N−1)th line is set to its logical "1", and at the same time, the first and third drain select lines are set to the logical "1" thereof. The first and third drain selectors in each sub-block are thereby turned on, in other words, made conductive.

At the same time, the third source select line is set to its logical "1". By this setting, for example, the third and seventh source selectors in a certain sub-block are turned on. At the same time, the column select line is set to its logical "1" so as to select the multiplexers having drain outputs supplied from the first and seventh source selectors. The NMOS-FETs in the selected multiplexers are thereby turned on.

In the memory cell device, in order to turn on the multi-valued memory cell in the third column of the (N−1)th line in a specific sub-block in the cell array, the drain selector in the third column and the multi-valued memory cell at the intersection of the (N−1)th line and the third column are turned on, thereby enabling a current coming from a common power supply line to flow from the left to the right of the multi-valued memory cell and further to flow to the source selector in the third line or row over the bit line at the right of the multi-valued memory cell. This current flows into the sense amplifier through the NMOS-FET of the multiplexer connected to the source selector in the third row. In the memory cell device, the sense amplifier determines a logical "1" by the current flowing thereinto.

In order to turn off the multi-valued memory cell at the intersection of the (N−1)th row and the third column, the multi-valued memory cell is made non-conductive to disable a sufficient current from the common power supply line from flowing into the bit line through the multi-valued memory cell. Thus, the sense amplifier determines a logical "0".

Similarly, in order to turn on the multi-valued memory cell at the intersection of the (N−1) th row and the first column, the drain selector in the first column and the multi-valued memory cell at the intersection of the (N−1) th row and the first column are turned on, thereby enabling a current from the common power supply line to flow from the right to the left of the multi-valued memory cell and to further flow to the source selector in the third row over the bit line at the left of the multi-valued memory cell. In this case, this current also flows into the sense amplifier through the NMOS-FET of the multiplexer connected to the source selector in the third row. In the memory cell device, the sense amplifier determines a logical "1" by the current flowing thereinto.

Similarly, in order to turn off the multi-valued memory cell at the intersection of the (N−1) th row and the first column, the multi-valued memory cell is made non-conductive to disable a sufficient current from flowing into the bit line at the left of the multi-valued memory cell. Thus, the sense amplifier determines a logical "0".

Well, a semiconductor memory device to which the above-described method for applying the voltage is applied aims at avoiding an increase in area of the memory cell array as far as possible while minimizing the influence on the readout operation by a leakage current, in other words, an interferential current flowing through one or ones, especially having data, of binary "1" stored, of the other multi-valued memory cells connected to the selected (N−1)th word line. However, even applying this method cannot completely negate the influence of the interferential current.

If data to be read out from the left to the right of the multi-valued memory cell at the intersection of the (N−1)th row and the third column are of the off state, i.e. logical "0", and data to be read out from the right to the left of the multi-valued memory cell at the intersection of the (N−1)th row and the first column are of the on state, i.e. logical "1", while the four memory cells therebetween are minimum in on-resistance component in both right and left directions to have the logical "1", then a current from the drain selector in the first row flows not only to the left bit line through the multi-valued memory cell at the intersection of the (N−1)th row and the first column but also to the bit line at the right of the multi-valued memory cell at the intersection of the (N−1) th row and the third column through the other four multi-valued memory cell connected to the (N−1)th word line as a small interferential current. The memory cell array is affected by the interferential current flowing thereinto to decrease its read out speed or to cause the sense amplifier to be virtually increased in threshold current from its actual value. These phenomena, from the viewpoint of power supply voltage and timing, deteriorate the access time, and hence access margin, to a remarkable extent.

As described above, the conventional semiconductor memory devices have a problem such that an interferential current flows to other multi-valued memory cells connected to a selected word line to exert a bad influence on the fast readout operation or operational margin. Especially, such a phenomenon can be almost negligible in the technique for storing one bit of data per direction of a multi-valued memory cell, but not in a memory cell device including multi-valued memory cells storing two or more bits of data per direction.

For such a problem, the solution taught by Tanaka may be effective, which discloses a semiconductor memory device having a memory cell array employing a virtual ground line system and formed in a hierarchical bit line structure including main and sub-bit lines. Tanaka discloses a solution for reducing a variation in wiring capacitance of the main bit lines to enable the fast readout.

The hierarchical bit line structure is advantageous in fast reading out data stored in, for example, a memory cell array for use in a semiconductor memory device of large storage capacity. The memory cell array in a hierarchical bit line structure is sectioned into a plurality of sub-blocks in its column direction. The bit lines in each sub-block are set as the sub-bit lines. A set of plural sub-bit lines in each sub-block is connected to the main bit line through a sub-block select transistor.

In order to select a memory cell, a main bit line is used as a bit line for the selection. Furthermore, a sub-bit line to be connected to the selected main bit line is selected by the sub-block select transistor.

Specifically, in FIG. 6 and paragraphs 0007 to 0012 of Tanaka, it is disclosed that, in order to prevent a detour outflow current corresponding to the interferential current from occurring, a charging potential is supplied to the sub-bit lines in another sub-block adjacent to the sub-block including the selected memory cell.

However, since the solution by Tanaka uses the main bit line for the source and drain electrodes of a multi-valued memory cell to be read, a bias for use in eliminating the interferential current has to be applied by a main bit line further adjacent thereto. As a result, between the sub-bit line used for readout and the biased main bit line, a bit line exists which may cause floating, thus enabling an interferential current to flow until this bit line is charged, which is also problematic. Because of the problems, it is indeed difficult in the solution by Tanaka to, solve the problems.

SUMMARY OF THE INVENTION

It is therefore an object of the present invention to provide a semiconductor memory device including memory cells, each of which outputs two or more bits of data per direction, operating fast and stably with an interferential current eliminated.

In accordance with the present invention, a semiconductor memory cell device includes an array of memory cells biased under a proper bias condition. More specifically, a semiconductor memory device comprises a memory array of nonvolatile memory cells arranged in rows and columns, the memory cells being sectioned into a plurality of sub-blocks, each of which has a predetermined number of memory cells, each of the memory cells having a control electrode responsive to a voltage on the control electrode to cause a stored content according to a conduction state between a first electrode and a second electrode to output. In the memory device, the memory cells are arranged so that the first electrode of each of the memory cells is connected in series to the second electrode of another of the memory cells which is adjacent to the memory cell. The memory array includes a word line commonly connected to the control electrodes of the memory cells arranged in a row direction, and a plurality of column lines connecting, in a column direction, connection points between the first and second electrodes of the memory cells connected in series. The memory device comprises a sense amplifier for detecting either a voltage level on or a current flowing over the column lines to read out the stored content in the memory cells, a first multiplexer for selecting one of the sub-blocks, which includes one of the memory cells which stores data to be read out in one of the rows to connect the selected sub-block to the sense amplifier, a drain selector for selecting first one of the column lines which is connected to one terminal of the memory cell storing the data to be read out, a precharge selector for selecting second one of the column lines which is connected to another terminal of one of the memory cells which is adjacent to the one terminal of the memory cell storing the data to be read out, a second multiplexer for selecting one of the sub-blocks which includes the second column line, and a source selector for selecting third one of the column lines which is connected to the other terminal of the memory cell storing the data to be read out, whereby the second multiplexer and the precharge selector apply a first voltage to the second column line, and the source selector applies a second voltage to the third column line.

Further in accordance with the present invention, a semiconductor memory device comprises a memory array of nonvolatile memory cells arranged in rows and columns, the memory cells being sectioned into a plurality of sub-blocks, each of which has a predetermined number of memory cells and is sectioned into a plurality of regions arranged in hierarchy, each of the memory cells having a control electrode responsive to a voltage on the control electrode to cause a stored content according to a conduction state between a first electrode and a second electrode to output. In the memory device, the memory cells are arranged so that the first electrode of each of the memory cells is connected in series to the second electrode of another of the memory cells which is adjacent to the memory cell. The memory array includes a word line commonly connected to the control electrodes of the memory cells arranged in a row direction, a plurality of main column lines for selecting the regions arranged in hierarchy, and a plurality of sub-column lines connecting, in a column direction, connection points between the first and second electrodes of the memory cells connected in series. The memory device comprises a sense amplifier for detecting either a voltage level on or a current flowing over the sub-column lines to read out the stored content in the memory cells, a first multiplexer for selecting one of the hierarchical regions in the sub-blocks which includes one of the memory cells which stores data to be read out in one of the rows to connect the selected hierarchical region to the sense amplifier, a second multiplexer for selecting another of the hierarchical regions in the sub-blocks which includes the one memory cell storing the data to be read out in the one row to connect the other hierarchical region selected to the sense amplifier, a first drain selector for selecting first one of the sub-column lines which is connected to one terminal of the memory cell storing the data to be read out and included in the one hierarchical region selected by the main column line, a second drain selector for selecting second one of the sub-column lines which is connected to one terminal of one of the memory cells which is adjacent to the memory cell storing the data to be read out and included in the other hierarchical region selected by the main column line, a first source selector for selecting third one of the sub-column lines which is connected to another terminal of the memory cell storing the data to be read out and included in the one hierarchical region, and a second source selector for selecting the third sub-column line connected to the other terminal of the memory cell storing the data to be read out and included in the other hierarchical region. One of the drain selectors in the same hierarchical region as the hierarchical region selected by the first multiplexer is selectively made conductive to apply a voltage from the sense amplifier through the selected drain selector to the first sub-column line. One of the drain selectors in a hierarchical region different from the hierarchical region selected by the second multiplexer is selectively made conductive to apply a first voltage to the second sub-column line in the different hierarchical region through the selected drain selector. One of the source selectors in the same hierarchical region as the hierarchical region selected by the second multiplexer is selectively made conductive to apply a second voltage to the third sub-column line in the same hierarchical region through the selected source selector.

In a semiconductor memory device in accordance with the present invention, the biasing condition is appropriately applied to the memory cell array as described above, thus eliminating the interferential current conventionally problematic to thereby accomplish the fast and stable operation. This is applicable to the readout operation for two or more bits of data per direction of a memory cell.

Further, in accordance with the present invention, each of the plurality of sub-blocks may have a predetermined number of memory cells and be sectioned into a plurality of regions arranged in hierarchy. Thus, in addition to eliminating the interferential current to allow the fast and stable operation, the source and drain selectors are separately controlled from each other, simplifying the circuit configuration for supplying the first voltage and minimizing the area required for the memory cell array.

BRIEF DESCRIPTION OF THE DRAWINGS

The objects and features of the present invention will become more apparent from consideration of the following detailed description taken in conjunction with the accompanying drawings in which:

FIG. 7A shows, in a form of table, truth values of precharge select signals supplied to the precharge selector in the memory cell device shown in FIG. 1;

FIG. 7B shows, in a form of table, truth values of source select signals supplied to the source selector in the memory cell device shown in FIG. 1;

FIG. 7C shows, in a form of table, truth values of drain select signals supplied to the drain selector and column select signals supplied to the two multiplexers in the memory cell device shown in FIG. 1;

FIG. 8 shows how FIGS. 8A, 8B and 8C are combined to depict an alternative embodiment of a semiconductor memory device in accordance with the present invention;

FIG. 8A is a schematic circuit diagram showing a configuration of a multiplexer, an odd-numbered side drain selector and an odd-numbered side source selector in the memory cell device of the alternative embodiment;

FIG. 8B is a schematic circuit diagram showing a configuration of an even-numbered side source selector, an even-numbered side drain selector, a multiplexer and a sense amplifier in the alternative embodiment;

FIG. 8C is a schematic circuit diagram showing a configuration of a memory cell array in the alternative embodiment;

FIG. 9A shows, in a form of table, truth values of drain select signals supplied to the drain selectors in the alternative embodiment;

FIG. 9B shows in a form of table, truth values of source select signals supplied to the source selectors in the alternative embodiment; and FIG. 9C shows, in a form of table, truth values of column select signals supplied to the multiplexer in the alternative embodiment.

DESCRIPTION OF THE PREFERRED EMBODIMENTS

Figure 1:
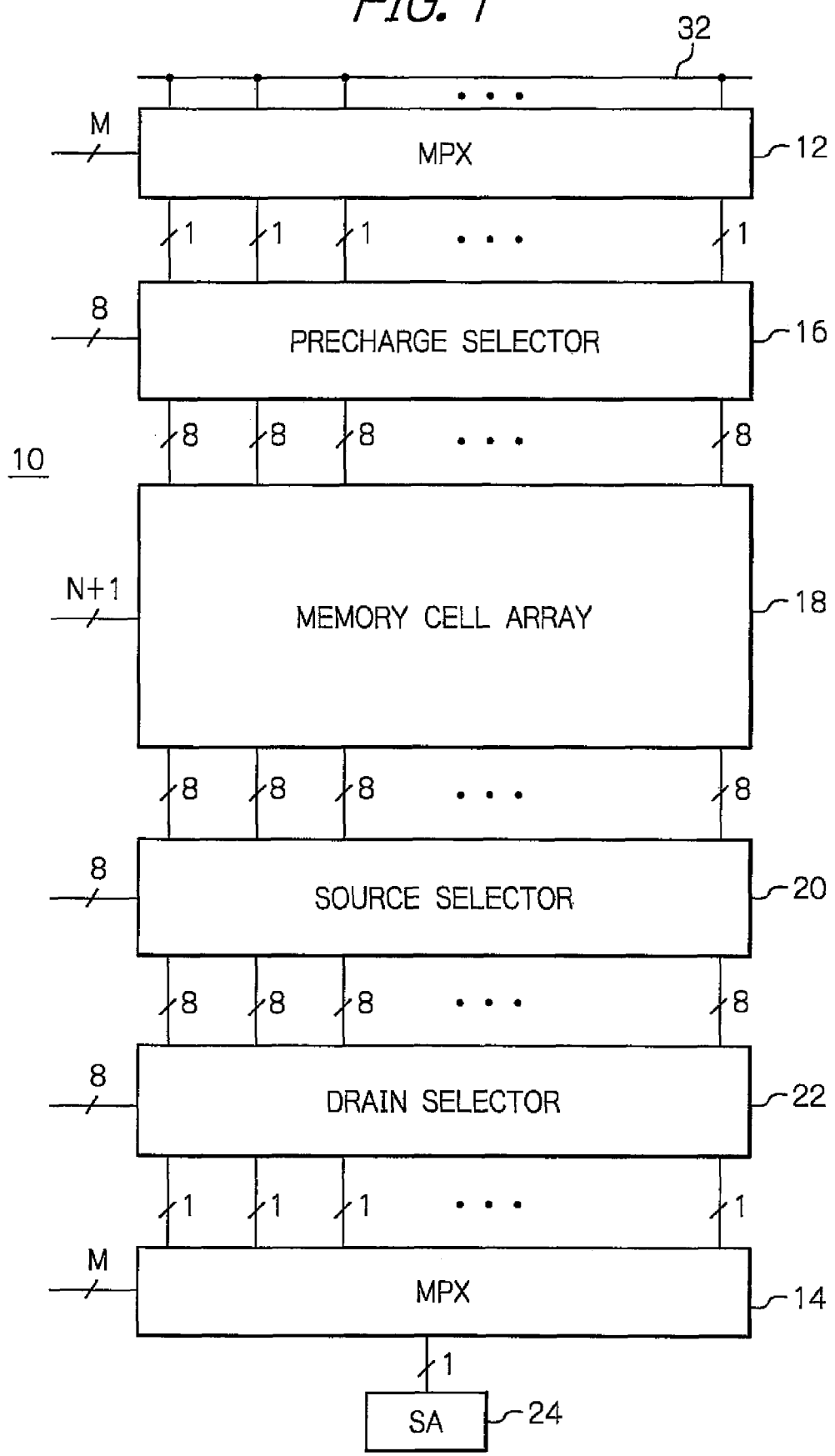
FIG. 1 is a schematic block diagram showing a configuration of an illustrative embodiment of a semiconductor memory device in accordance with the present invention.

Well, reference will be made to accompanying drawings to describe a semiconductor memory device in accordance with preferred embodiments of the present invention. With reference first to FIG. 1, in a semiconductor memory device 10 in accordance with a preferred embodiment, a sense amplifier 24 is adapted to detect either a voltage level on or a current flowing over a column line; and, when reading out a stored content, or data, in a multi-valued memory cell of the memory cell device 10, a multiplexer (MPX) 14 selects a sub-block including one of the memory cells, which has data to be read out stored, in a row, a drain selector (DS) 22 selects a first column line connected to one terminal of the memory cell having the data to be read out, a precharge selector 16 selects a second column line connected to the other terminal of one of the memory cells which adjacent to the one terminal of the memory cell having the data to be read out, another multiplexer 12 selects a sub-block including the second column line, and a source selector (SS) 20 selects a third column line connected to the other terminal of the memory cell having the data to be read out, whereupon the conditions of biasing a memory cell array 18 are such that the selection by the multiplexer 12 and the precharge selector 16 applies a first voltage to the second column line and the selection by the source selector 20 applies a second voltage to the third column line. Thus, an interferential current conventionally problematic is eliminated, establishing a fast and stable operation. This is applied to allowing a readout operation for two or more bits of data per direction of a memory cell.

The memory cell device 10 includes the multiplexers 12 and 14, precharge selector 16, memory cell array 18, source selector 20, drain selector 22 and sense amplifier 24 which are interconnected as shown in FIG. 1. Elements or portions not directly relevant to understanding the present invention will neither be described nor shown merely for simplicity.

In the memory cell device 10, between the multiplexers 12 and 14, the precharge selector 16, there are arranged the memory cell array 18, the source selector 20 and the drain selector 22. The multiplexer 14 is connected to the sense amplifier (SA) 24 having an amplification function.

Figure 2:
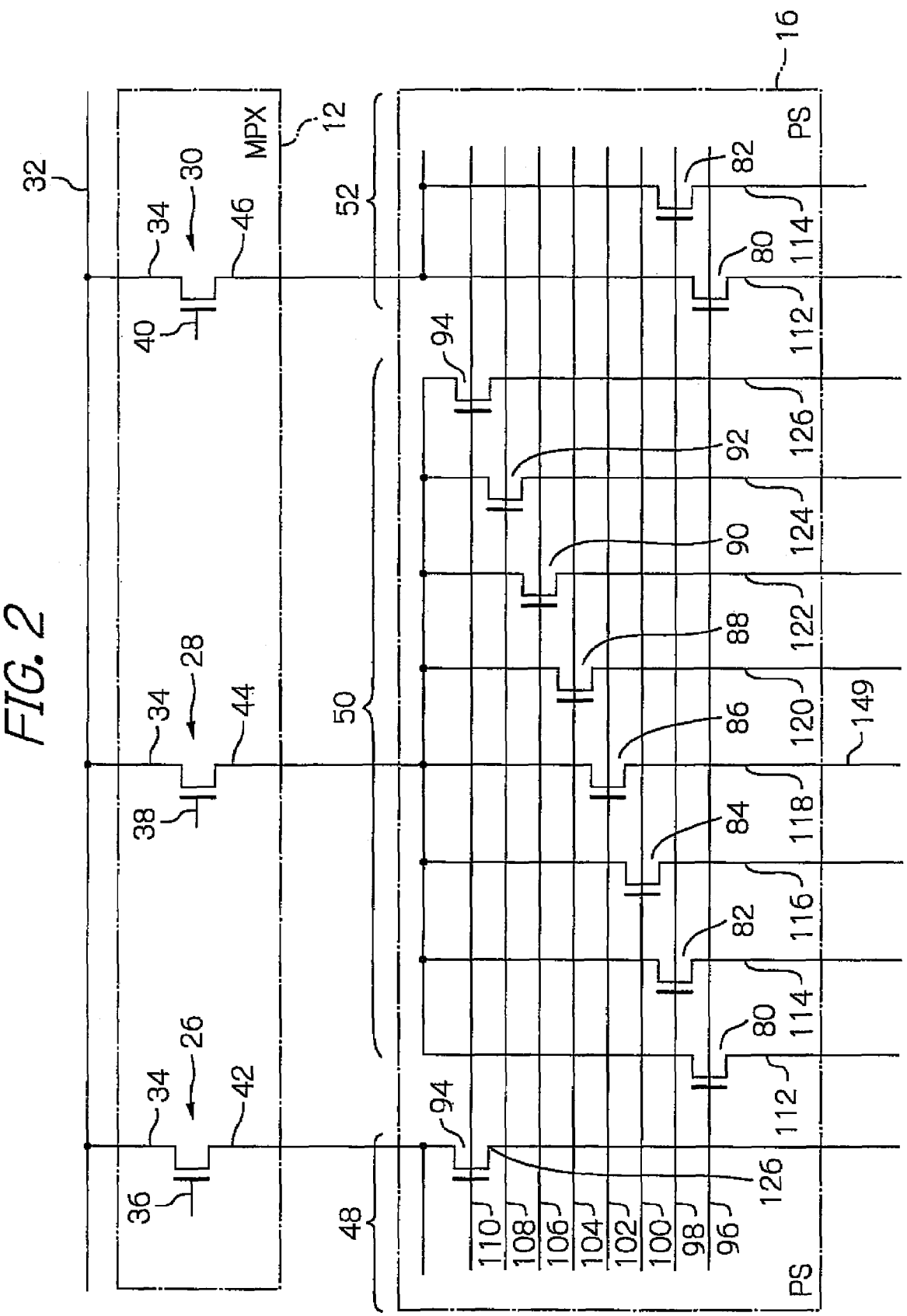
FIG. 2 is a schematic circuit diagram showing a configuration of the multiplexer and precharge selector in the memory cell device shown in FIG. 1.

The one multiplexer 12 has a function to select a column. In order to perform this function, the multiplexer 12 includes, as shown in FIG. 2, M NMOS-FETs (N-channel Metal-Oxide Semiconductor Field-Effect Transistors) 26, 28, 30 and so on, where M is a natural number. Each of the NMOS-FETs 26, 28, 30, . . . has its source electrode 34 commonly connected to a common power supply line VPC (Voltage of Power in Common) 32. To the gate electrodes of the NMOS-FETs 26, 28, 30, . . . , column select signals 36, 38, 40, . . . are respectively supplied. The column select signals 36, 38, 40, . . . correspond to column select lines PY(i−1), PY(i), PY(i+1), . . . , respectively. In the description, signals are designated with reference numerals for connection lines on which they appear.

The NMOS-FETs 26, 28, 30, . . . have the drain electrodes 42, 44, 46, . . . thereof, respectively, connected to the precharge selector 16. The precharge selector 16 includes, as described below, a set of NMOS-FETs, such as 80-94, connected correspondingly to each of sub-blocks (SBK) 48, 50, 52, . . . . Therefore, the memory cell device 10 includes M sub-blocks SBK disposed in a row direction. Each of the sub-block in this embodiment has eight memory cells 156, FIG. 5, disposed in the row direction.

Figure 3:
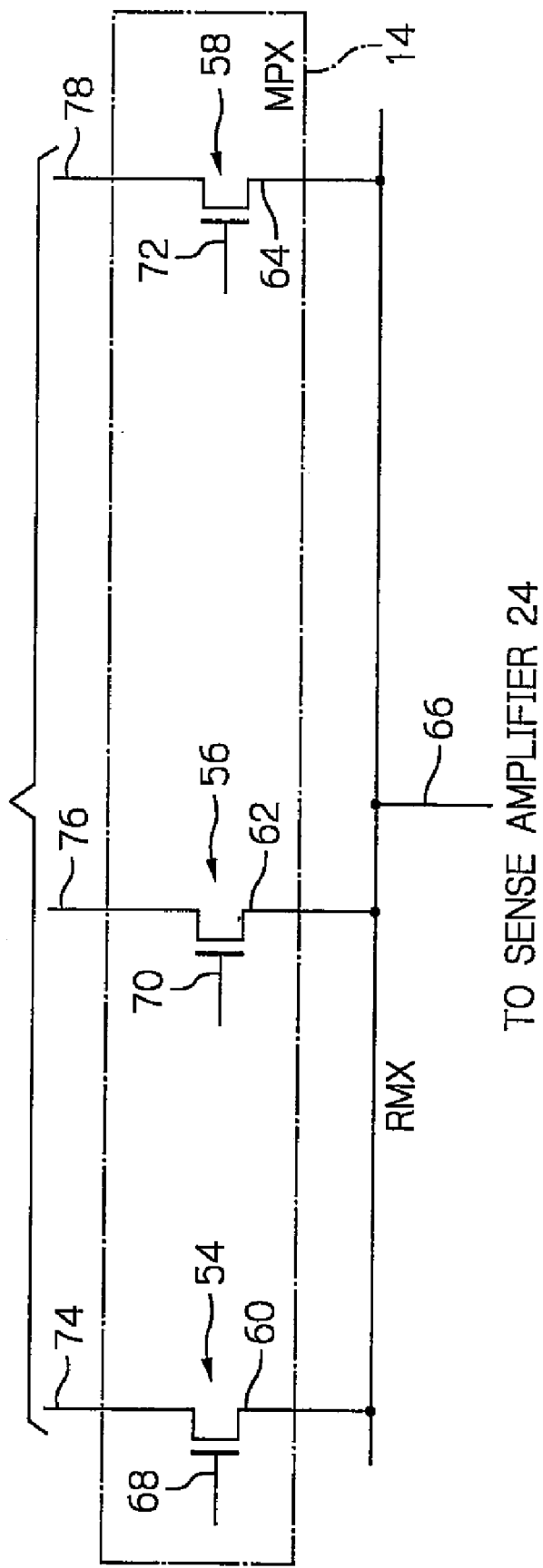
FIG. 3 is a schematic circuit diagram showing a configuration of the multiplexer in the memory cell device shown in FIG. 1.
Figure 4:
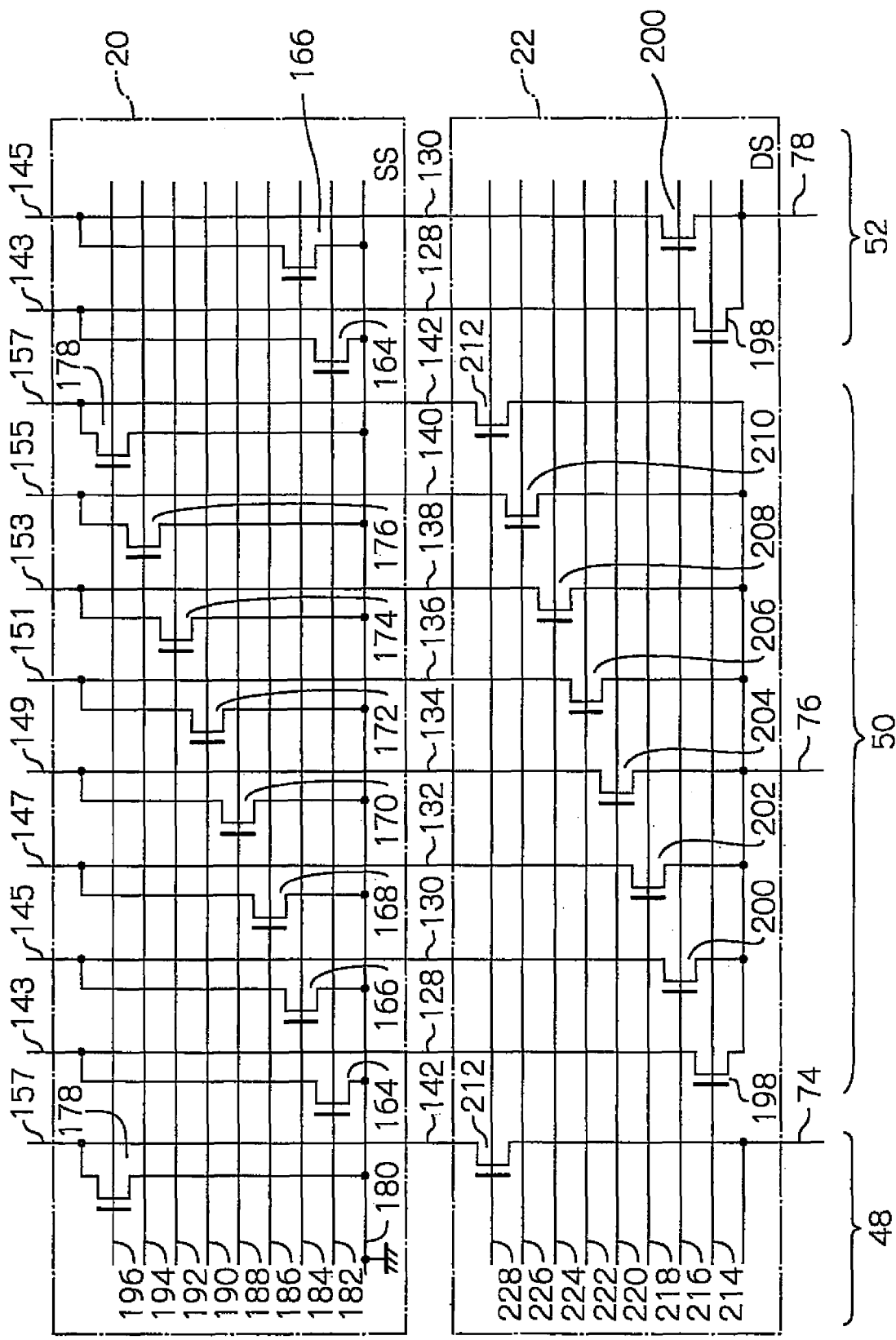
FIG. 4 is a schematic circuit diagram showing a configuration of the source and drain selectors in the memory cell device shown in FIG. 1.

The other multiplexer 14 has a function to select a column also. The multiplexer 14, as shown in FIG. 3, includes M NMOS-FETs 54, 56, 58, . . . also. The NMOS-FETs 54, 56, 58, . . . have the source electrodes thereof 60, 62, 64, . . . commonly connected to the sense amplifier 24 through a common node RMX, 66, and have column select signals 68, 70, 72, . . . supplied, respectively. The column select signal 68, 70, 72, . . . are supplied to the gate electrodes of the NMOS- FETs 54, 56, 58, respectively. The column select signals 68, 70, 72, ... correspond to column select lines RY(i−1), RY(i), RY(i+1), respectively. In addition, the NMOS-FETs 54, 56, 58, ... are, as shown in FIG. 4, connected to the drain electrodes 74, 76, 78, ... of the drain selector 22 corresponding to the sub-blocks SBK 48, 50, 52, ... described above, respectively.

The precharge selector 16 has a precharge select function. In order to select a row of the memory cell in each sub-block, the precharge selector 16 in each sub-block includes eight NMOS-FETs 80, 82, 84, 86, 88, 90, 92 and 94. In order to avoid repetitive descriptions, the sub-block 50 will be exemplified. In the sub-block 50, the NMOS-FETs 80, 82, 84, 86, 88, 90, 92 and 94 have the source electrodes thereof commonly connected to the drain electrode of the NMOS-FET 28 in the multiplexer 12. The NMOS-FETs 80, 82, 84, 86, 88, 90, 92 and 94 have the gate electrodes thereof receiving the eight precharge select signals 96, 98, 100, 102, 104, 106, 108 and 110 (PS00-PS07), respectively. The NMOS-FETs 80, 82, 84, 86, 88, 90, 92 and 94 have the drain electrodes 112, 114, 116, 118, 120, 122, 124 and 126 thereof connected to the source electrodes 128, 130, 132, 134, 136, 138, 140 and 142 of the drain selector 22, as shown in FIG. 4, respectively, through the memory cell array 18 and the source selector 20. Accordingly, these lines in the column direction form eight bit lines BL 143, 145, 147, 149, 151, 153, 155 and 157.

Figure 5:
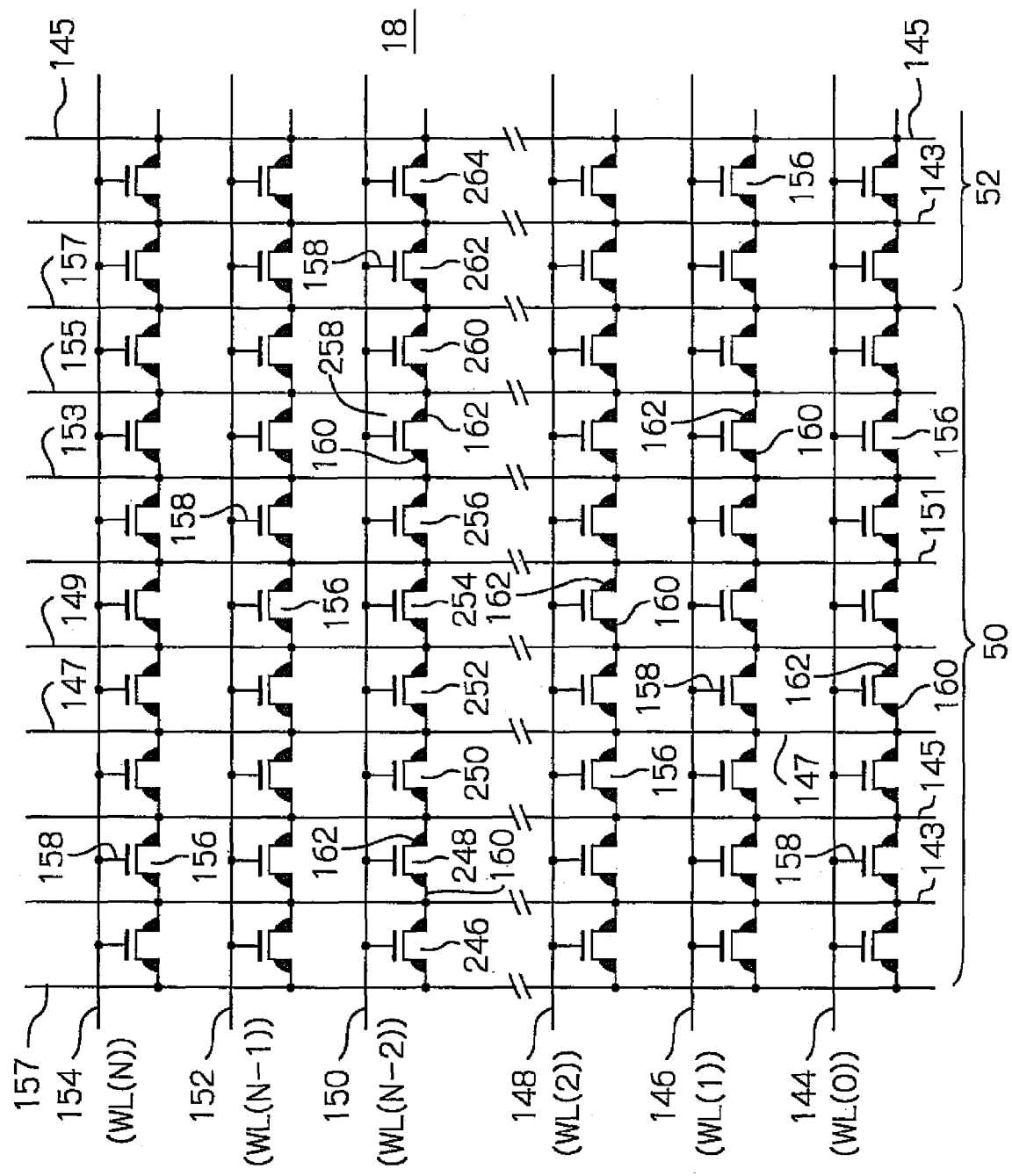
FIG. 5 is a schematic circuit diagram showing a configuration of a memory cell array in the memory cell device shown in FIG. 1.

The memory cell array 18 is sectioned into the sub-blocks, each of which has multi-valued memory cells 156, FIG. 5, aligned in the matrix form of (N−1) rows×eight columns. In the memory cell array 18, the multi-valued memory cells 156 aligned in the row direction in each of the rows are connected to a word line WL. Thus, the N+1 word lines WL are formed in total. Accordingly, the word lines WL run crossing the bit lines running in the column direction at the substantially right angle. The word lines WL, more specifically WL(0), WL(1), WL(2), WL(N−2), WL(N−1) and WL(N), FIG. 5, receive N+1 line select signals 144, 146, 148, ..., 150, 152 and 154 supplied, respectively.

In the memory cell array 18, as seen from FIG. 5, between the bit lines adjacent to each other, one nonvolatile multi-valued memory cell 156 is interconnected. Each of the multi-valued memory cells 156 has its memory entity, i.e. memory functioning body, composed of a nitride film formed on the sidewall of a gate electrode 158. The memory cell 156 has its electrodes 160 and 162 formed of N-type diffusion regions extending below the memory entity. Between the multi-valued memory cells 156 adjacent to each other, the corresponding electrodes 160 and 162 are connected to the bit line in between, as shown in FIG. 5.

Since the array of multi-valued memory cells 10 is structured as described above, it can be used for reading out stored data from intended one of the memory cells 156 by controlling a voltage to be applied to the electrodes 160 and 162 adjacent to each other with a bit line in between, although connected to each other, over the bit line so as to render the respective electrodes serving as a source and a drain electrode, or alternatively as a drain and a source electrode. Each multi-valued memory cell 156 has its gate electrode 158 connected to the word line WL and functioning as a control electrode.

With this structure, desired one of the multi-valued memory cells 156 may be selected by specifying one of the sub-blocks and supplying the precharge select signal and the line select signal, and write or read out data, dependent upon a voltage to be applied.

The source selector 20 has a function to select a multi-valued memory cell 156 functioning as a source. The source selector 20 includes NMOS-FETs 164, 166, 168, 170, 172, 174, 176 and 178, the number of which is designed depending on the number of the bit lines. Each of the NMOS-FETs 164, 166, 168, 170, 172, 174, 176 and 178 has its source electrode 180 grounded, and its drain electrode connected to corresponding one of the bit lines. In the source selector 20, the NMOS-FETs 164, 166, 168, 170, 172, 174, 176 and 178 receive source select signals 182, 184, 186, 188, 190, 192, 194 and 196 supplied to the respective gate electrodes.

The drain selector 22 has a function to select a multi-valued memory cell 156 functioning as a drain. In the sub-block 50, for example, the drain selector 22 is also formed of NMOS-FETs 198, 200, 202, 204, 206, 208, 210 and 212, the number of which is designed depending on the number of the bit lines. The NMOS-FETs 198, 200, 202, 204, 206, 208, 210 and 212 have the drain electrodes thereof connected to the bit lines 143, 145, 147, 149, 151, 153, 155 and 157, respectively, and the source electrodes thereof connected in common by a signal line 76 to the drain electrode of the NMOS-FET 56, FIG. 3, in the multiplexer 14. In the drain selector 22, the NMOS-FETs 198, 200, 202, 204, 206, 208, 210 and 212 receive drain select signals 214, 216, 218, 220, 222, 224, 226 and 228 supplied to the respective gate electrodes.

The memory cell device 10 is structured as described above allows the multiplexer 12 and the precharge selector 16 to select a bit line to form a first voltage supplier supplying, for example, a voltage of the common power supply line 32 as a first voltage to the selected bit line, and the source selector 20 to select a bit line to form a second voltage supplier supplying, for example, a voltage of the common power supply line 180, i.e. the ground level, to the selected bit line, and further allows the drain selector 22 and the multiplexer 14 to function, in the same multi-valued memory cell row, as a connection mechanism for connecting at least one selected bit line to the sense amplifier 24.

Figure 6:
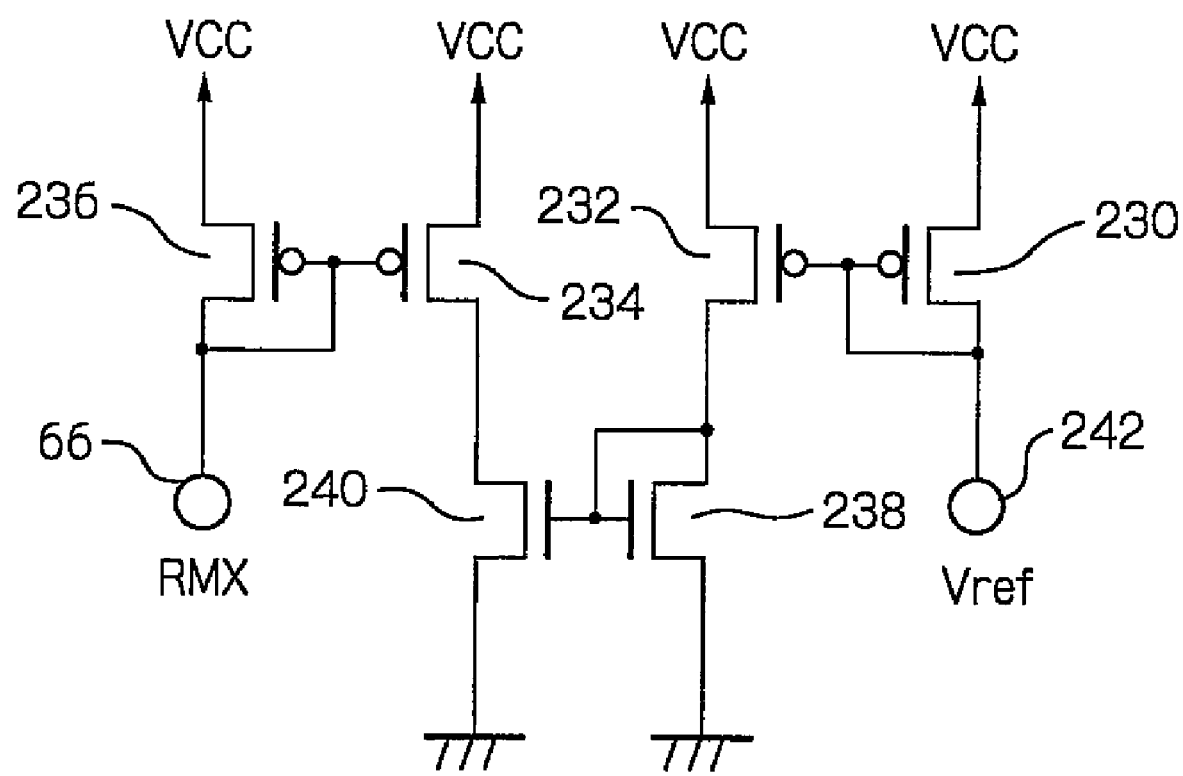
FIG. 6 is a schematic circuit diagram showing a configuration of the sense amplifier in the memory cell device shown in FIG. 1.

The sense amplifier 24 has a function to detect whether or not a current flows to the ground through the selected multi-valued memory cell 156 to thereby read out a content stored in the multi-valued memory cell 156. With reference to FIG. 6, the sense amplifier 24 includes P-channel type MOS-FETs, i.e. PMOS-FETs, 230, 232, 234 and 236, and NMOS-FETs 238 and 240, which are interconnected as illustrated.

The sense amplifier 24 has its input terminal 242 on which a reference current $I_{ref}$ is input and which is connected to the drain and gate electrodes of the PMOS-FET 230. The PMOS-FET 230 also has its gate electrode connected to the gate electrode of the PMOS-FET 232. The PMOS-FETs 230, 232, 234 and 236 have the source electrodes thereof connected to a power line VCC. The PMOS-FET 232 has its drain electrode connected to the drain and gate electrodes of the NMOS-FET 238. The NMOS-FET 238 has its gate electrode connected to the gate electrode of the NMOS-FET 240. The NMOS-FETs 238 and 240 have the source electrodes thereof grounded in common. The NMOS-FET 240 has its drain electrode connected to the drain electrode of the PMOS-FET 234. The PMOS-FET 234 has its gate electrode connected to the gate and drain electrodes of the PMOS-FET 236. The PMOS-FET 236 has its drain electrode connected to the output terminal 66 of the sense amplifier 24, namely, to the common node RMX.

As is clear from FIG. 6, the PMOS-FETs 230 and 232, the NMOS-FETs 238 and 240, and the PMOS-FETs 234 and 236 function as current mirror circuits, respectively.

The sense amplifier 24 is adapted to conduct the reference current $I_{ref}$ supplied on the input terminal 242 to the channel between the source and drain electrodes of the PMOS-FET 230 to form a predetermined drain current, thus causing a current corresponding to this drain current to flow through the PMOS-FET 232 and the NMOS-FET 238. A current corresponding to the current flowing through the PMOS-FET 232 and the NMOS-FET 238 flows through the PMOS-FET 234 and the NMOS-FET 240. Furthermore, a current corresponding to the current flowing through the PMOS-FET 234 and the NMOS-FET 240 flows through the PMOS-FET 236 to be outputted from the output terminal 66, i.e. common node RMX.

Next, the operation of the memory cell device 10 in accordance with the illustrative embodiment will be described. The memory cell device 10 operates based on truth values, shown in FIGS. 7A, 7B and 7C, of precharge select signals PS00 to PS07, source select signals SS00 to SS07, drain select signals DS00 to DS07, and column select signals PY(i−1), PY(i), PY(i+1), . . . , RY(i−1), RY(i), RY(i+1), . . . .

The truth values shown in FIGS. 7A, 7B and 7C are specifically directed to the state of selecting applied voltages when reading out data from, e.g. in FIG. 5, one 250 of the multi-valued memory cells 246 to 260 of the sub-block 50 in the (N−2)th row from the right to the left toward the multi-valued memory cell 252 adjacent thereto. To the multi-valued memory cell 250, an address decoder or the like, not shown, supplies the truth values shown in the figures of the column select signal, the precharge select signal, the source select signal, the drain select signal and the line select signal at the same time.

In this case, while on the word line WL (N−2) the binary "1" of line select signal 150 is supplied, a control circuit or the like, not shown, supplies the binary values "1" of the drain select signal 218 (DS02) shown in FIG. 7C and the source select signal 184 (SS01) shown in FIG. 7B. In turn, the NMOS-FET 202 of the drain selector 22 and the NMOS-FET 166 of the source selector 20 are turned on to be selected. At the same time, the binary "1" of precharge signal 102 (PS03) is supplied to render the NMOS-FET 86 of the precharge selector 16 turned on to be selected. Furthermore at the same time, in the multiplexers 12 and 14, the binary values "1" of the column select signal 38 (PY(i)) and the column select signal 70 (RY(i)) are supplied to render the NMOS-FET 28 and 56 turned on to be selected, respectively.

The voltage of the common power supply line 32 (VPC) is in turn supplied to the bit line 149 through the NMOS-FET 28 in the multiplexer 12 and the NMOS-FET 86 in the precharge selector 16. The sense amplifier 24 is connected through the common node 66 (RMX) to the NMOS-FET 56 of the multiplexer 14, FIG. 3, which is, when conductive, further connected to the NMOS-FET 202 of the drain selector 22, FIG. 4. The bit line 147 connected to the drain electrode of the NMOS-FET 202 and hence to the NMOS-FET 56 is connected to the drain electrode of the NMOS-FET 168 of the source selector 20. When the NMOS-FET 166 of the source selector 20 is selected, the NMOS-FET 166 is made conductive. The source and drain electrodes of the NMOS-FET 166 are connected to the common power supply line 180 (AGND) and the bit line 145, respectively.

The voltage of the common power supply line 32 (VPC) in the multiplexer 12 is set so as to be substantially equal to a voltage VBL (Voltage of Bit Line) applied to the bit line in a readout operation, the voltage being equal to, e.g. 2.2V, thereby the bit lines 147 and 149 being equal in voltage to each other.

The voltage relationship between a voltage VWL of the word line WL and a voltage VBL of the bit line BL will be described by means of a threshold voltage Vtcell of the multi-valued memory cell 156. In the case of setting voltages so as to satisfy the voltage relationship (VWL−VBL<Vtcell) as in the case of the voltages VWL equal to 2.7V and Vtcell equal to 1.1V, the multi-valued memory cell 252 is not turned on. Therefore, the current flowing over the bit line 147 includes only a component flowing from the right of a multi-valued memory cell 250 to be read to the left of the multi-valued memory cell 252, not conductive. When the multi-valued memory cell 250 is turned off in this voltage relationship, no current flows over the bit line 147. As described above, the voltage relationship is set such that the multi-valued memory cell 252 is not turned on, allowing the interferential current to be entirely eliminated on the bit line 147.

When the voltage of the common power supply line 180 (AGND) is now set to the ground level to be substantially equal to that of the non-selected word line, it is possible to prevent voltages from being applied to the multi-valued memory cells 246, 248, 254, 256, 258, 260, 262 and 264 which are not connected to the selected bit line 147 but to the non-selected word lines, such as the word line 148 (WL (2)), not involved in the readout operation. In the memory cell device 10, a wasteful current can thus be prevented from flowing through the non-selected multi-valued memory cells.

As shown in FIG. 5, to the multi-valued memory cells 256, 258, 260, 262 and 264 disposed at the right of the multi-valued memory cell 254 in the same row as the multi-valued memory cell 252, a voltage is applied between the common power supply line 32 (VPC) and the common power supply line 180 (AGND). Therefore, if all the multi-valued memory cells 256, 258, 260, 262 and 264 are in the condition of allowing a current to flow from themselves toward the multi-valued memory cell adjacent on the right, a current would flow from the bit line 149 to the bit line 145 in the sub-block 52.

However, the serial on-resistance components of the multi-valued memory cells 254 to 264 are not low. In addition, a current path is not formed from the bit line 147 under readout operation to the bit line 149. Therefore, a current flowing from the bit line 149 to the bit line 145 in the sub-block 52 does not influence the readout operation.

Furthermore, in the sub-block 48, when the source select signal 184 (SS01) is supplied, the bit line, not shown, of the sub-block 48 is made conductive with the common power supply line 180 (AGND). That renders the multi-valued memory cells 246 and 248, or the multi-valued memory cell 156 disposed at the left of the multi-valued memory cell 248 in the sub-block 50 biased on the right and left sides to the voltage of the common power supply line 180 (AGND), so that no current is conducted. Therefore, the multi-valued memory cell 250 connected to the bit line 147 is not influenced at all by the interferential current in the readout operation.

In the instant embodiment, the memory cell device 10 is set under the proper bias condition of the voltage relationship (VWL−VBL<Vtcell) and (VBL=VPC) to thereby eliminate the interferential current, accomplishing the fast and stable operation. Then, the level of the threshold voltage Vtcell or the like of the multi-valued memory cell 156 may appropriately be designed so as to attain the readout of two or more bits of data per direction of a multi-valued memory cell.

It is to be noted that the present invention is not restricted to the specific illustrative embodiment. The illustrative embodiment includes the precharge selector 16, the source selector 20 and the drain selector 22 formed by the sub-blocks, each of which includes eight columns, as shown in FIG. 1. However, the invention is not restricted by this specific layout. In addition, the multi-valued memory cell 156 of the memory cell array 18 is exemplified as a memory storing one bit of data per direction. However, the type of memory cell storing one bit of data in one physical cell may be implemented by providing the memory entity only on one side of the gate electrode 158.

The bias condition for the memory cell device 10 is also not restricted by this specific embodiment, but any other conditions may be applied so far as a multi-valued memory cell adjacent to and sharing the bit line with a multi-valued memory cell to be read is not turned on, or unnecessary, interferential current does not flow for the sense amplifier 24. In addition, NMOS-FETs are used for all the elements of the multi-valued memory cell 156, the precharge selector 16, the source selector 20 and the drain selector 22. The invention is not restricted by this specific type of transistors. Other types of transistors such as PMOS-FETs are of course applicable.

Furthermore, in this specific embodiment, the precharge selector 16, the source selector 20 and the drain selector 22 are designed to take the binary "1" when selected and the binary "0" when not selected. However, depending upon the voltage level applied from the sense amplifier 24 or the level of the common power supply line VPC, the levels, when selected/not selected, may be set to a voltage step down or up from the reference level, rather than the direct reference levels such as the power supply or the ground level.

In addition, the function of the sense amplifier 24 may be implemented by other circuit configuration than what is shown in FIG. 6.

Next, an alternative embodiment of the memory cell device 10 will be described in accordance with the present invention. In this alternative embodiment, like components and elements are designated with the same reference numerals, and repetitive descriptions thereon will be omitted.

The memory cell device 10 of the instant alternative embodiment has, unlike the preceding embodiment, the structure of hierarchical bit line wiring. By employing this wiring structure, the memory cell device 10 is characterized in eliminating the precharge selector 16 shown in FIG. 1, and normally forming between the multiplexers 12 and 14 the sub-blocks of drain and source selectors in a plurality of stages cascaded in the column direction, as described below. The connection relationship of the memory cell device 10 of the instant alternative embodiment is shown in FIGS. 8A, 8B and 8C, when combined as shown in FIG. 8.

Figure 8B:
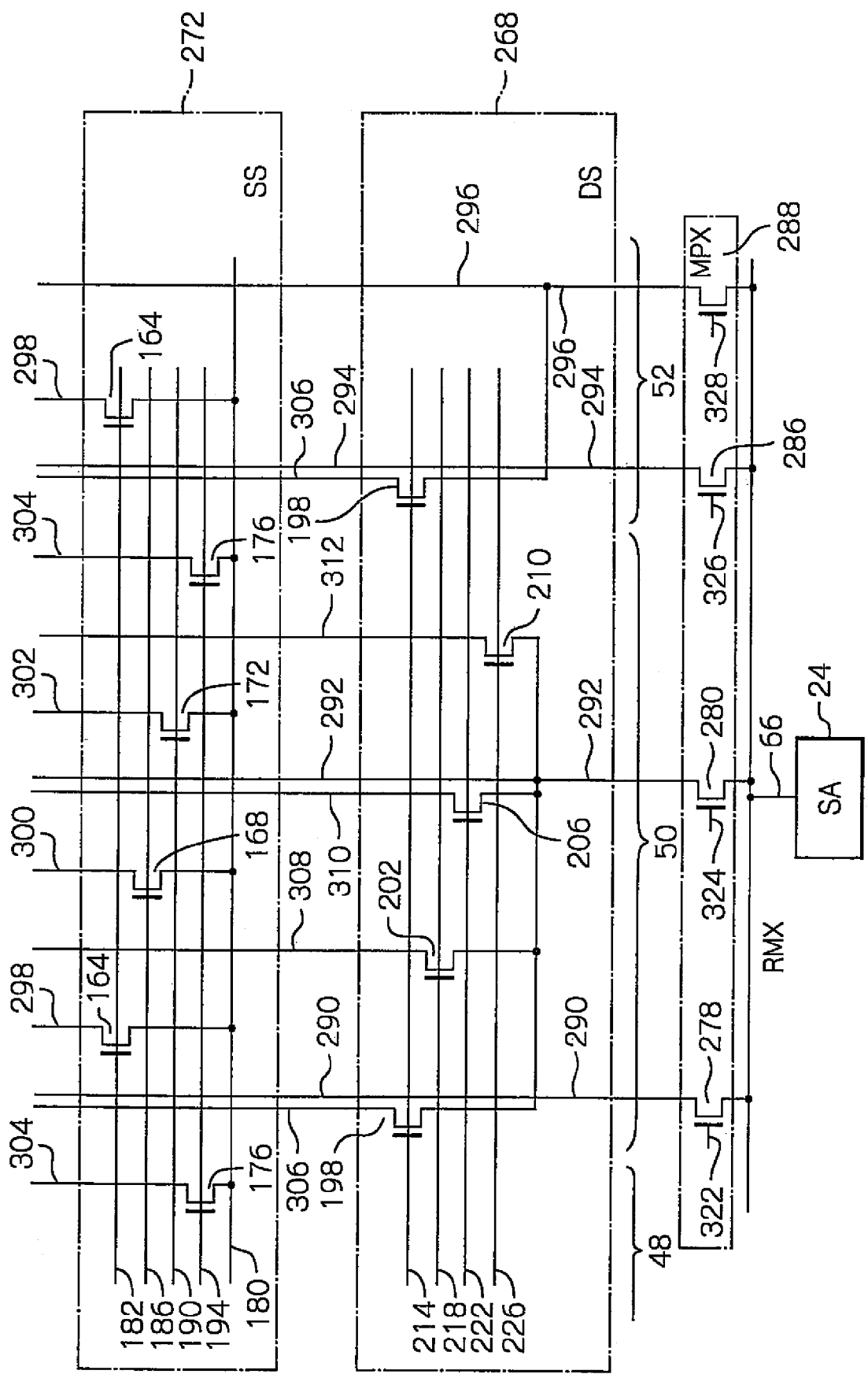
Figure 8C:
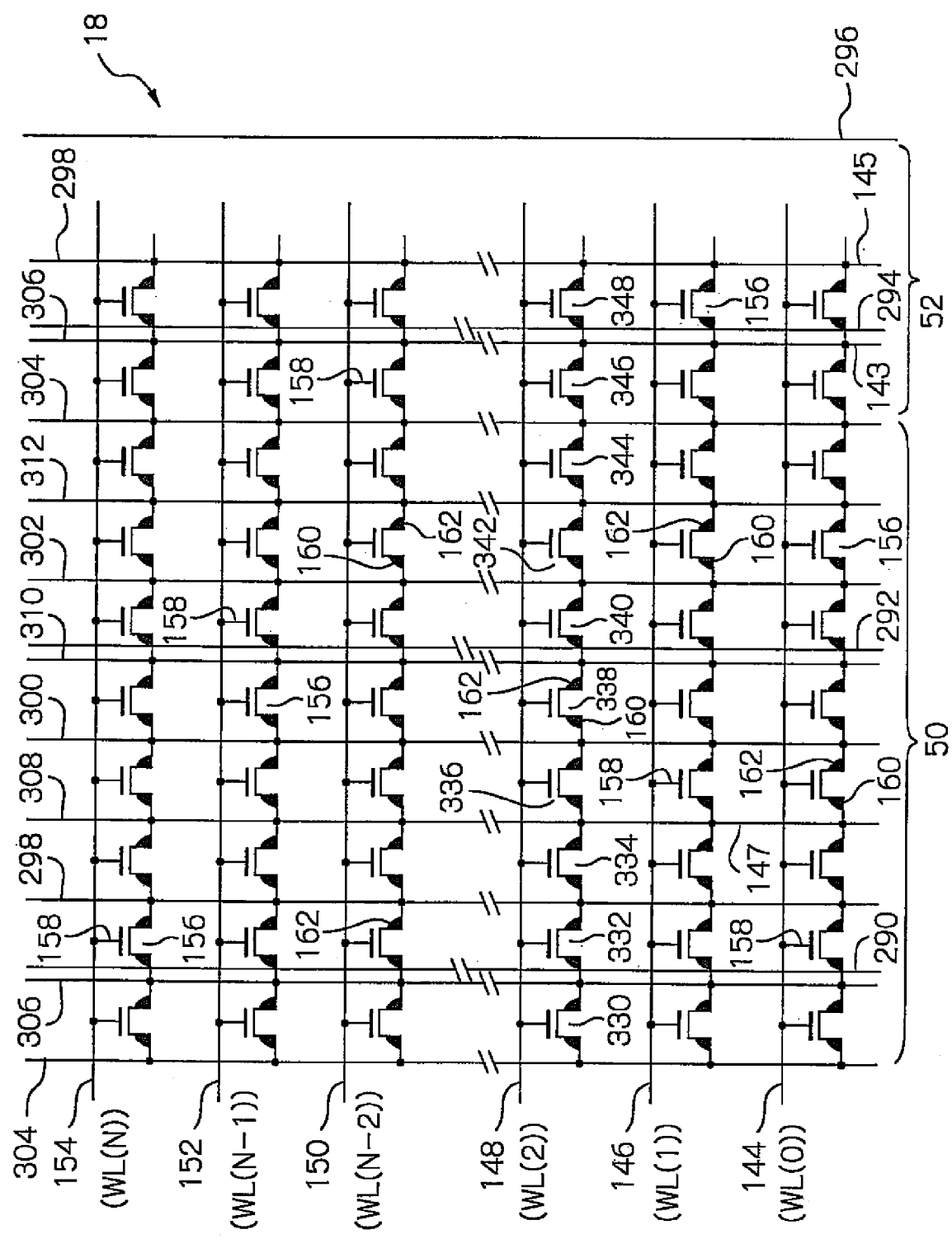

Specifically with reference to FIGS. 8A and 8B, the sub-blocks of drain selectors 266 and 268 and source selectors 270 and 272 are aligned into two stages. Accordingly, the drain selectors 266 and 268 shown in FIGS. 8A and 8B, respectively, correspond to the drain selector 22 in the preceding embodiment. Likewise, the source selectors 270 and 272 shown in FIGS. 8A and 8B, respectively, correspond to the source selector 20 in the preceding embodiment. The memory cell array 18 of the alternative embodiment shown in FIG. 8C forms in one stage the sub-blocks 48, 50, 52, . . . connected in parallel in the row direction, like the preceding embodiment.

The multiplexers 12 and 14 shown in FIGS. 8A and 8B, respectively, include the same number of NMOS-FETs as the stages of the sub-blocks formed by the drain selectors 266 and 268 and the source selector 270 and 272 described above. To see the sub-block 50, the multiplexer 12 includes NMOS-FETs 274 and 276, and the multiplexer 14 includes NMOS-FETs 278 and 280 in the sub-block 50. Accordingly, the multiplexer 12 includes NMOS-FETs 282 and 284, and the multiplexer 14 includes NMOS-FETs 286 and 288 in the sub-block 52. Correspondingly, main bit lines (MBL) are provided for the respective sub-blocks, described below, so as to be equal in number to the stages.

The multiplexer 12 is connected to the multiplexer 14 by main bit lines 290 MBL0(i), 292 MBLE(i), 294 MBLE(i+1), 296 MBLO(i+1), . . . . Accordingly, the NMOS-FETs 274, 276, 282, 284, . . . have the drain electrodes thereof connected to the drain electrodes of the NMOS-FETs 278, 280, 286, 288, . . . by the main bit lines 290, 292, 294, 296, . . . , respectively. The multiplexer 14 is connected to the sense amplifier 24 by the signal line 66 to form the common node RMX like the preceding embodiment.

Continuing to see the sub-block 50, the main bit line 290 also diverges to be connected to the drain selector 266, FIG. 8A, and the main bit line 292 also diverges to be connected to the drain selector 268, FIG. 8B. The drain selector 266 includes NMOS-FETs 200, 204, 208 and 212, and the drain selector 268 includes NMOS-FETs 198, 202, 206 and 210. The NMOS-FETs 200, 204, 208 and 212 have the source electrodes thereof connected to the main bit line 290, and the NMOS-FETs 198, 202, 206 and 210 have the source electrodes thereof connected to the main bit line 292.

Similarly, to see the sub-block 50, the source selector 270 includes NMOS-FETs 164, 168, 172 and 176, and the source selector 272 includes NMOS-FETs 166, 170, 174 and 178. The NMOS-FETs 164 to 178 have the source electrodes thereof connected to the ground line 180.

In the sub-block 50, the drain selector 266 is connected to the source selector 272, and the drain selector 268 is connected to the source selector 270. In addition, the respective connection relationships in the drain selector 266 and the source selector 272 will be described in detail. The NMOS-FET 200 has its drain electrode connected to the drain electrode of the NMOS-FET 164 by a sub-bit line 298 SBL1(i). The NMOS-FET 204 has its drain electrode connected to the drain electrode of the NMOS-FET 168 by a sub-bit line 300 SBL3(i). The NMOS-FET 208 has its drain electrode connected to the drain electrode of the NMOS-FET 172 by a sub-bit line 302 SBL5(i). Additionally, the NMOS-FET 212 has its drain electrode connected to the drain electrode of the NMOS-FET 178 by a sub-bit line 304 SBL7(i).

The connection relationships in the drain selector 268 and the source selector 270 will also be described in detail. The NMOS-FET 198 has its drain electrode connected to the drain electrode of the NMOS-FET 166 by a sub-bit line 306 SBL0 (i). The NMOS-FET 202 has its drain electrode connected to the drain electrode of the NMOS-FET 166 by a sub-bit line 308 SBL2(i) The NMOS-FET 206 has its drain electrode connected to the drain electrode of the NMOS-FET 170 by a sub-bit line 308 SBL4(i). Additionally, the NMOS-FET 210 has its drain electrode connected to the drain electrode of the NMOS-FET 174 by a sub-bit line 310 SBL6(i).

The memory cell array 18 includes, as shown in FIG. 5, the 8×M×(N+1) multi-valued memory cells 156. To see the sub-block 50 again, the memory cell array 18 shown in FIG. 5C has not only the sub-bit lines 298 to 312 but also the main bit lines 290 and 292 wired in the column direction for the sub-blocks 49, 50, 52, . . . .

Next, the connection in the row direction will be described. In the multiplexer 12, the NMOS-FETs 274, 276, 282, 284, . . . have the source electrodes thereof commonly connected to the common power supply line VPC 32, and the gate electrodes thereof supplied with column select signals 314, 316, 318, 320, . . . . The column select signals 314, 316, 318, 320, . . . may be represented by PYE(i), PYO(i), PYE(i+1), PYO(i+1), . . . , respectively.

In the multiplexer 14, the NMOS-FETs 278, 280, 286, 288, . . . have the source electrodes thereof commonly connected to the common power supply line VPC 32, and the gate electrodes supplied with column select signals 322, 324, 326, 328, . . . . The column select signals 322, 324, 326, 328, . . . may be represented by RYE(i), RYO(i), RYE(i+1), RYO(i+1), respectively.

In the drain selector 266, the NMOS-FETs 200, 204, 208 and 212 have the gate electrodes thereof fed with drain select signals 216, 220, 224 and 228, respectively. The drain select signals 216, 220, 224 and 228 correspond to DS01, DS03, DS05 and DS07 of the odd-numbered side shown in FIG. 9A, respectively.

In the source selector 272, the NMOS-FETs 164, 168, 172 and 176 have the gate electrodes thereof supplied with source select signals 182, 186, 190 and 194, respectively. The source select signals 182, 186, 190 and 194 correspond to SS00, SS02, SS04 and SS06 of the even-numbered side shown in FIG. 9B, respectively.

Similarly, in the drain selector 268, the NMOS-FETs 198, 202, 206 and 210 have the gate electrodes thereof supplied with drain select signals 214, 218, 222 and 226, respectively. The drain select signals 214, 218, 222 and 226 correspond to DS00, DS02, DS04 and DS06 of the even-numbered side shown in FIG. 9A, respectively.

Additionally, in the source selector 270, the NMOS-FETs 166, 170, 174 and 178 have the gate electrodes thereof fed with source select signals 184, 188, 192 and 196, respectively. The source select signals 184, 188, 192 and 196 correspond to SS01, SS03, SS05 and SS07 of the odd-numbered side shown in FIG. 9B, respectively.

Next, the operation of the memory cell device 10 in accordance with the instant alternative embodiment will be described. The memory cell device 10 operates based on truth values, shown in FIGS. 9A, 9B and 9C, of the source select signals SS00 to SS07, the drain select signals DS00 to DS07, and the column select signals PY(i−1), PY(i), PY(i+1), . . . , RY(i−1), RY(i), RY(i+1).

The truth values shown in FIGS. 9A, 9B and 9C are specifically directed to the state of selecting applied voltage when reading out data from, for example, in FIG. 8C, one 344 of the multi-valued memory cells 330 to 348 of the sub-blocks 50 and 52 in the second row from the left to the right, i.e. from the right of the multi-valued memory cell 344 to the left of the multi-valued memory cell 346. To the multi-valued memory cell 344, the address decoder or the like, not shown, supplies the truth values shown in those figures of the column select signal, the source select signal, the drain select signal and the line select signal supplied at the same time.

In this case, while on the word line WL2 the binary "1" of line select signal 148 is supplied, the control circuit or the like, not shown, supplies the binary values "1" of the drain select signal 226 (DS06) shown in FIG. 9A and the source select signal 194 (SS06) shown in FIG. 9B. In turn, the NMOS-FET 210 of the drain selector 268 and the NMOS-FET 176 of the source selector 270 are turned on to be selected.

At the same time, the binary value "1" of drain select signal 224 (DS05) shown in FIG. 5A is supplied to render the NMOS-FET 208 of the drain selector 266 turned on. At the same time, the binary values "1" of column select signals 324 (RYO(i)) and 314 (PYE(i)) are supplied to render the NMOS-FETs 280 and 274 of the multiplexers 14 and 12 turned on, respectively.

To the sub-bit line 302 (SBL5(i)), the voltage on the common power supply line 32 (VPC) is in turn applied through the NMOS-FET 274 in the multiplexer 12, the main bit line 290 (MBLE(i)) and the drain selector 266. To the sub-bit line 312 (SBL6(i)), the voltage is applied from the sense amplifier 24 through the NMOS-FET 280 in the multiplexer 14, the main bit line 292 (MBLO(i)) and the NMOS-FET 210 of the drain selector 268. In this case, the NMOS-FET 176 of the source selector 272 is turned on, thereby rendering the sub-bit line 304 (SBL7(i)) to the common power supply line 180 (AGND) level.

In the readout operation by the sense amplifier 24, when this connection state is formed and the voltage on the common power supply 32 and the voltage VBL applied to the sub-bit line SBL are set equal to, for example, 2.2V, the voltages of the sub-bit lines SBL5(i) and SBL6(i) are substantially equal to each other.

Hereinafter, the relationship between a voltage VWL of the word line WL and a voltage VBL of the bit line BL will be described by means of a threshold voltage Vtcell of the multi-valued memory cell 156. In the case of setting voltages satisfying the voltage relationship (VWL−VBL<Vtcell), as when the voltages VWL equal to 2.7V and Vtcell equal to 1.1V, the multi-valued memory cell 342 is not turned on, so that a current flowing over the bit line 312 includes only a component flowing from the right to the left of the multi-valued memory cell 344 to be read out. When the multi-valued memory cell 344 is turned off in this voltage relationship, no current flows over the bit line 312. As described above, the voltage relationship is set such that the multi-valued memory cell 342 is not turned on, allowing the interferential current for the bit line 312 to be entirely eliminated.

Now, when the voltage of the common power supply line 180 is set to the ground level to be substantially equal to that of the non-selected word line, it is possible to prevent voltages from being applied to the multi-valued memory cells 156 connected to the non-selected word lines WL not involved in the readout operation and to the sub-bit lines other the selected sub-bit line SBL. This can prevent wasteful current from flowing.

Between the multi-valued memory cells 330 and 340, a voltage corresponding to a difference between the common power supply line 32 and the ground level is applied. In the condition where it is possible for all the multi-valued memory cells 330 to 340 to conduct a current from themselves toward the left, a current would flow from the sub-bit line 302 (SBL5(i)) to 304 (SBL7(i−1)). However, the serial on-resistance components of the multi-valued memory cells 330 to 340 are not low. In, addition, a current path is not formed from the sub-bit line 312 (SBL6(i)) under readout operation to the sub-bit line 302 (SBL5(i)). Therefore, a current flowing from the sub-bit line 302 SBL(i) to 304 (SBL7(i−1) does not influence the readout operation.

Furthermore, in the right adjacent sub-block 52, not shown in FIGS. 8A and 8B, when the sub-bit line SBL is selected by the source select signal 194 (SS06) to be connected to the common power supply 180, the multi-valued memory cells 346 and 348, or the multi-valued memory cell 156 disposed at the right of the multi-valued memory cells 346 and 348 are biased on the right and left sides to the voltage of the common power supply 180, thus causing no current to flow therebetween. Therefore, the multi-valued memory cell 344 on the sub-bit line 312 (SBL6(i)) is not influenced at all in the readout operation.

The configuration and operation in accordance with the instant alternative embodiment can provide the several advantageous effects as described below.

The memory cell device 10 is set under the proper bias condition of the voltage relationship (VWL−VBL<Vtcell) and (VBL=VPC) to thereby eliminate the interferential current, attaining the fast and stable operation. Hence, the level of the threshold voltage Vtcell or the like of the multi-valued memory cell 156 may appropriately be designed so as to attain the readout of two or more bits of data per direction of a multi-valued memory cell.

The source selector 20 and the drain selector 22 are controlled separately between the even and odd sub-bit lines, thus rendering the precharge selector 16 in the preceding embodiment omitted from the alternative embodiment. In the case of a hierarchical bit line structure, the area for the memory cell array can be reduced.

Furthermore, according to the solution of Tanaka described earlier, between the sub-bit line for use in readout and the main bit line biased, a bit line causing floating exists to conduct the interferential current until the latter bit line is charged, which is problematic. By contrast, the instant alternative embodiment uses the main bit line MBL only for the drain electrode of a multi-valued memory cell 156 to be read. Therefore, the biased sub-bit line, e.g. SBL5(i), exists adjacent to the sub-bit line SBL6(i) for use in readout, thus solving the problem raised by Tanaka. Furthermore, in the solution of Tanaka, the power supply voltage and the ground voltage are selectively to be applied as biasing. However, in the instant alternative embodiment, only one kind of voltage is sufficient for biasing, thus readily controlling the applied voltage.

Additionally, the present alternative embodiment uses the main bit line MBL only as the drain electrode of a multi-valued memory cell 156 to be read. Therefore, for example, for the NMOS-FETs 208 and 210 of the drain selectors on the path from the main bit line MBLE(i) over the sub-bit line SBL5(i), the multi-valued memory cell 344 and the sub-bit line SBL6(i) to the sense amplifier 24, without considering decrease in threshold voltage Vtcell of transistors, the readout circuit can be configured by a single sort of transistor such as a PMOS-FET transistor. When the main bit line MBL is used as a source and a drain electrode like with Tanaka, if both PMOS-FET and NMOS-FET transistors are not provided, then the threshold voltage Vtcell would be decreased. Therefore, the circuit would not be implemented by a single transistor. However, with the alternative embodiment, the readout circuit can be configured by a single transistor.

In addition, in the instant alternative embodiment, like the preceding embodiment, the drain selectors 266 and 268, and the source selectors 270 and 272 are designed to take the same configuration every eight columns. The invention is not restricted to this specific layout. Likewise, the multi-valued memory cell 156 is exemplified as a memory storing one bit of data per direction, but may be of a type of memory cell storing one bit of data in one physical cell.

The bias condition for the memory cell device 10 may be, like the preceding embodiment, of any other conditions so far as a multi-valued memory cell 156 adjacent to and sharing the sub-bit line SBL with a multi-valued memory cells 156 to be read is not turned on, or unnecessary, interferential current does not flow for the sense amplifier 24. The drain selectors 266 and 268 and the source selectors 270 and 272 are entirely of NMOS-FET transistors, but other types of transistors such as PMOS-FET transistors are applicable rather than the NMOS-FET transistors.

In the alternative embodiment, the multi-valued memory cells 156 are of NMOS-FETs, but may not be restricted by this type of transistors. The invention may be applied to other types of transistors such as PMOS-FET transistors. When PMOS-FETs are applied to the multi-valued memory cells 156, a multi-valued memory cell 156 to be read is supplied with the common power supply 180, i.e. approximately 2.2V, from the ground, and the voltage of the selected word line WL is set to 0V, and the voltage of the non-selected word line is set to the common power supply 32, VCC, with the voltage relationship of |VWL−VBL|<|Vtcell| and VBL equal to VPC, which is equal to about 0.2 to 0.4V. Thus, almost the same advantageous effects can be attained as the alternative embodiment described above.

With alternative embodiment, like the preceding embodiment, for the drain selectors 266 and 268 and the source selectors 270 and 272, the selected and unselected levels simply take binary "1" and "0". However, it is needless to say that, depending upon the voltage level applied from the sense amplifier 24 or the level of the common power supply line VPC, those levels, when selected/not selected, may be set to a voltage step down or up from the reference level, rather than the direct reference levels such as the power supply or the ground level.

Finally, the drain selector 266 and the source selector 270 of the odd-numbered side and the drain selector 268 and the source selector 272 of the even-numbered side are arranged on the both sides with respect to the memory cell array 18, but may be arranged in either one side of the memory cell array 18.

The entire disclosure of Japanese patent application No. 2008-80494 filed on Mar. 26, 2008, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor memory device comprising a memory array of nonvolatile memory cells arranged in rows and columns, said memory cells being sectioned into a plurality of sub-blocks, each of which has a predetermined number of memory cells, each of said memory cells having a control electrode responsive to a voltage on the control electrode to cause a stored content according to a conduction state between a first electrode and a second electrode to output, wherein said memory cells are arranged so that the first electrode of each of said memory cells is connected in series to the second electrode of another of said memory cells which is adjacent to said memory cell, said memory array including:

a word line commonly connected to the control electrodes of said memory cells arranged in a row direction; and a plurality of column lines connecting, in a column direction, connection points between the first and second electrodes of the memory cells connected in series, said device comprising:

a sense amplifier for detecting either a voltage level on or a current flowing over said column lines to read out the stored content in said memory cells;

a first multiplexer for selecting one of said sub-blocks, which includes one of said memory cells which stores data to be read out in one of the rows to connect the selected sub-block to said sense amplifier;

a drain selector for selecting first one of said column lines which is connected to one terminal of the memory cell storing the data to be read out;

a precharge selector for selecting second one of said column lines which is connected to another terminal of one of said memory cells which is adjacent to the one terminal of the memory cell storing the data to be read out;

a second multiplexer for selecting one of said sub-blocks which includes the second column line; and a source selector for selecting third one of said column lines which is connected to the other terminal of the memory cell storing the data to be read out, whereby said second multiplexer and said precharge selector apply a first voltage to the second column line, and said source selector applies a second voltage to the third column line.

2. The device in accordance with claim 1, wherein a voltage level on the first column line is substantially equal to the second voltage.

3. The device in accordance with claim 2, wherein a difference in voltage between said word line and said first column line is set to be lower than a threshold voltage of said memory cells.

4. A semiconductor memory device comprising a memory array of nonvolatile memory cells arranged in rows and columns, said memory cells being sectioned into a plurality of sub-blocks, each of which has a predetermined number of memory cells and is sectioned into a plurality of regions arranged in hierarchy, each of said memory cells having a control electrode responsive to a voltage on the control electrode to cause a stored content according to a conduction state between a first electrode and a second electrode to output, wherein said memory cells are arranged so that the first electrode of each of said memory cells is connected in series to the second electrode of another of said memory cells which is adjacent to said memory cell, said memory array including:

a wordline commonly connected to the control electrodes of said memory cells arranged in a row direction;

a plurality of main column lines for selecting the regions arranged in hierarchy; and a plurality of sub-column lines connecting, in a column direction, connection points between the first and second electrodes of the memory cells connected in series, said device comprising:

a sense amplifier for detecting either a voltage level on or a current flowing over said sub-column lines to read out the stored content in said memory cells;

a first multiplexer for selecting one of said hierarchical regions in said sub-blocks which includes one of the memory cells which stores data to be read out in one of the rows to connect the selected hierarchical region to said sense amplifier;

a second multiplexer for selecting another of the hierarchical regions in said sub-blocks which includes the one memory cell storing the data to be read out in the one row to connect the other hierarchical region selected to said sense amplifier;

a first drain selector for selecting first one of the sub-column lines which is connected to one terminal of the memory cell storing the data to be read out and included in the one hierarchical region selected by said main column line;

a second drain selector for selecting second one of the sub-column lines which is connected to one terminal of one of the memory cells which is adjacent to the memory cell storing the data to be read out and included in the other hierarchical region selected by said main column line;

a first source selector for selecting third one of the sub-column lines which is connected to another terminal of the memory cell storing the data to be read out and included in the one hierarchical region; and a second source selector for selecting the third sub-column line connected to the other terminal of the memory cell storing the data to be read out and included in the other hierarchical region, one of said drain selectors in a same hierarchical region as the hierarchical region selected by said first multiplexer being selectively made conductive to apply a voltage from said sense amplifier through said selected drain selector to the first sub-column line, one of said drain selectors in a hierarchical region different from the hierarchical region selected by said second multiplexer being selectively made conductive to apply a first voltage to the second sub-column line in the different hierarchical region through said selected drain selector, one of said source selectors in the same hierarchical region as the hierarchical region selected by said second multiplexer being selectively made conductive to apply a second voltage to the third sub-column line in the same hierarchical region through said selected source selector.

5. The device in accordance with claim 4, wherein a voltage level on the first sub-column line is substantially equal to the second voltage.

6. The device in accordance with claim 5, wherein a difference in voltage between said word line and said first column line is set to be lower than a threshold voltage of said memory cells.

* * * * *